(12) United States Patent
Merl et al.

(10) Patent No.: US 10,197,755 B1
(45) Date of Patent: Feb. 5, 2019

(54) FIBER OPTIC TRANSCEIVER FPGA MEZZANINE CARD (FMC)

(71) Applicant: Triad National Security, LLC, Los Alamos, NM (US)

(72) Inventors: Robert Merl, Los Alamos, NM (US); Paul Graham, Los Alamos, NM (US); Nikolai Mondragon, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 15/818,893

(22) Filed: Nov. 21, 2017

Related U.S. Application Data (60) Provisional application No. 62/425,152, filed on Nov. 22, 2016.

(51) Int. Cl.
*G02B 6/42* (2006.01)
*H04B 10/40* (2013.01)
*H05K 1/18* (2006.01)
*H05K 1/02* (2006.01)

(52) U.S. Cl.
CPC ........... *G02B 6/428* (2013.01); *G02B 6/4246* (2013.01); *G02B 6/4284* (2013.01); *H04B 10/40* (2013.01); *H05K 1/0245* (2013.01); *H05K 1/181* (2013.01); *H05K 2201/09227* (2013.01); *H05K 2201/10015* (2013.01); *H05K 2201/10121* (2013.01); *H05K 2201/10151* (2013.01); *H05K 2201/10189* (2013.01); *H05K 2201/10318* (2013.01); *H05K 2201/10522* (2013.01)

(58) Field of Classification Search
None
See application file for complete search history.

(56) References Cited

U.S. PATENT DOCUMENTS

| | | | | |
|---|---|---|---|---|
| 7,212,961 | B2 * | 5/2007 | Settles | G06F 11/261 361/737 |
| 9,560,785 | B1 * | 1/2017 | Brigham | H05K 7/10 |
| 2008/0043448 | A1 * | 2/2008 | Finnerty | G06F 1/20 361/748 |
| 2009/0251867 | A1 * | 10/2009 | Sharma | H04Q 1/08 361/737 |
| 2016/0110306 | A1 * | 4/2016 | Lin | G06F 13/4081 710/302 |
| 2016/0275034 | A1 * | 9/2016 | Chang | G06F 13/4027 |
| 2017/0147044 | A1 * | 5/2017 | Slaton | G06F 1/20 |

* cited by examiner

*Primary Examiner* — Tina M Wong
(74) *Attorney, Agent, or Firm* — Leonardpatel P.C.; Michael Aristo Leonard, II; Sheetal Surech Patel (57) ABSTRACT

A fiber optic transceiver FPGA mezzanine card (FMC) is capable of operating in radiation environments. The fiber optic transceiver FMC may be used with radiation-hardened and non-hardened FPGAs. The FMC may enable high speed serial communications, such as gigabit Ethernet, PCI express, serial rapid IO, and/or other high speed serial protocols over the fiber.

18 Claims, 11 Drawing Sheets

FIG. 3F

FIBER OPTIC TRANSCEIVER FPGA MEZZANINE CARD (FMC)

CROSS-REFERENCE TO RELATED APPLICATION

This application claims the benefit of U.S. Provisional Patent Application No. 62/425,152 filed Nov. 22, 2016. The subject matter of this earlier-filed application is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to Field Programmable Gate Array (FPGA) mezzanine cards (FMCs), and more particularly, to a fiber optic transceiver FMC.

BACKGROUND

FMC is an industry standard form factor card for input/output to FPGA carrier cards that conforms to the VITA 57 American National Standards Institute (ANSI) industry standard, which has been adopted by a wide ecosystem of commercial and military manufacturers. FMCs can also support high speed fiber optic network connections. However, conventional fiber optic FMCs are not radiation-hardened, and thus are not suited for operation in radiation environments, such as space. Accordingly, radiation-hardened FMC implementations may be desirable for radiation environments.

SUMMARY

Certain embodiments of the present invention may provide solutions to the problems and needs in the art that have not yet been fully identified, appreciated, or solved by conventional fiber optic FMCs. For example, some embodiments of the present invention pertain to a fiber optic transceiver FMC that is capable of operating in radiation environments. In some embodiments, the fiber optic transceiver FMC may be used with radiation-hardened and non-hardened FPGAs.

In an embodiment, an FMC includes a first slot for a first optical transceiver on a first layer of the FMC and a second slot for a second optical transceiver on the first layer of the FMC. The FMC also includes a first fiber optic cable connector associated with the first slot for the first optical transceiver and a second fiber optic cable connector associated with the second slot for the second optical transceiver. The FMC includes six layers that improve signal integrity and lower power plane impedance. The FMC conforms to ANSI industry standard VITA 57.

In another embodiment, an FMC includes a plurality of capacitors that provide power supply bypassing and improve power stability of the FMC and a plurality layers that improve signal integrity and lower power plane impedance.

In yet another embodiment, an FMC includes a first layer that includes an FMC connector and a plurality of controlled impedance differential pair traces that include transmit and receive trace pairs for each of the first slot and the second slot. The plurality of controlled impedance differential pair traces are operably connected to the FMC connector. The FMC also includes a second layer including a first ground plane. Ground pins on a first optical transceiver and a second optical transceiver and grounded sides of a plurality of capacitors are directly connected to the first ground plane. The FMC further includes a third layer that includes a plurality of electrically single-ended traces and a plurality of lower speed serial peripheral interface (SPI) connections that control configurations of the first optical transceiver and the second optical transceiver, and are routed on the traces of the third layer. Additionally, the FMC includes a fourth layer that includes a second ground plane that improves signal integrity and reduces noise on the FMC and a fifth layer that includes a solid power plane. Power from the FMC connector is supplied to the fifth layer and the first optical transceiver and the second optical transceiver then draw power from the fifth layer. The FMC also includes a sixth layer that includes "break-outs" for pins of the FMC connector. The pins of the FMC connector include small traces that allow each pin to "escape" or "break-out" from FMC connector and then attach to internal traces on the FMC.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to a fiber optic transceiver FMC that is capable of operating in radiation environments, such as space, accelerators, nuclear power plants, etc. In some embodiments, the fiber optic transceiver FMC may be used with radiation-hardened and non-hardened FPGAs. The FMC in some embodiments may host two high speed radiation-hardened fiber optic transceivers. The FMC of some embodiments is compatible with offerings from industry that conform to the VITA 57 ANSI standard and may be readily integrated into systems manufactured by other vendors. Carrier cards that have FMC sites may host these FMC cards, and thus receive radiation-hardened fiber optic communications capabilities. The FMC of some embodiments enables high speed serial communications, such as gigabit Ethernet, PCI express, serial rapid IO, and/or other high speed serial protocols over the fiber without deviating from the scope of the invention.

In current satellites, for example, copper wiring is used for conveying signals in the irradiated environment of space. However, copper cables are relatively slow compared to other transmission media, such as fiber optic cables including certain types of glass. Furthermore, cables can only run for a certain length, and copper is relatively heavy, which is a significant drawback for space applications. Since some satellites can be very large, conventional copper cables can add expense and add weight that would be reduced using fiber optics. Fiber is not typically used in space applications due to radiation concerns. More specifically, existing telecommunications fiber optic cables can suffer from radiation effects in space and may not work, or may fail over time.

Accordingly, some embodiments enable boards in a satellite, for example, to communicate between one another using fiber optic cables connected to fiber optic transceiver FMCs. Some embodiments may provide a development board platform that enables engineers to experiment with radiation-hardened fiber optics for space to prototype new technologies without actually building and sending the component to space beforehand. Such capabilities may put developers a year ahead in a space instrument development cycle, which typically takes 4-5 years. Thus, the ability to shave a year or more off the development cycle and bring new products to market faster is extremely beneficial.

The fiber optic transceiver FMCs may be used to run signals through hundreds of meters of fiber optic cable in some embodiments. Existing fiber optic cables may darken in a radiation environment. This may make them unusable over time. Fiber optic cables made from newer materials may not suffer from this darkening effect. Research is in progress to determine how newer materials will perform. Research is also in progress on methods that use the optical transceiver itself to extend the lifetime of the cables used in the radiation environment. Some embodiments may use the FMC form factor to make them compatible with existing equipment without physical modifications.

Figure 1A:
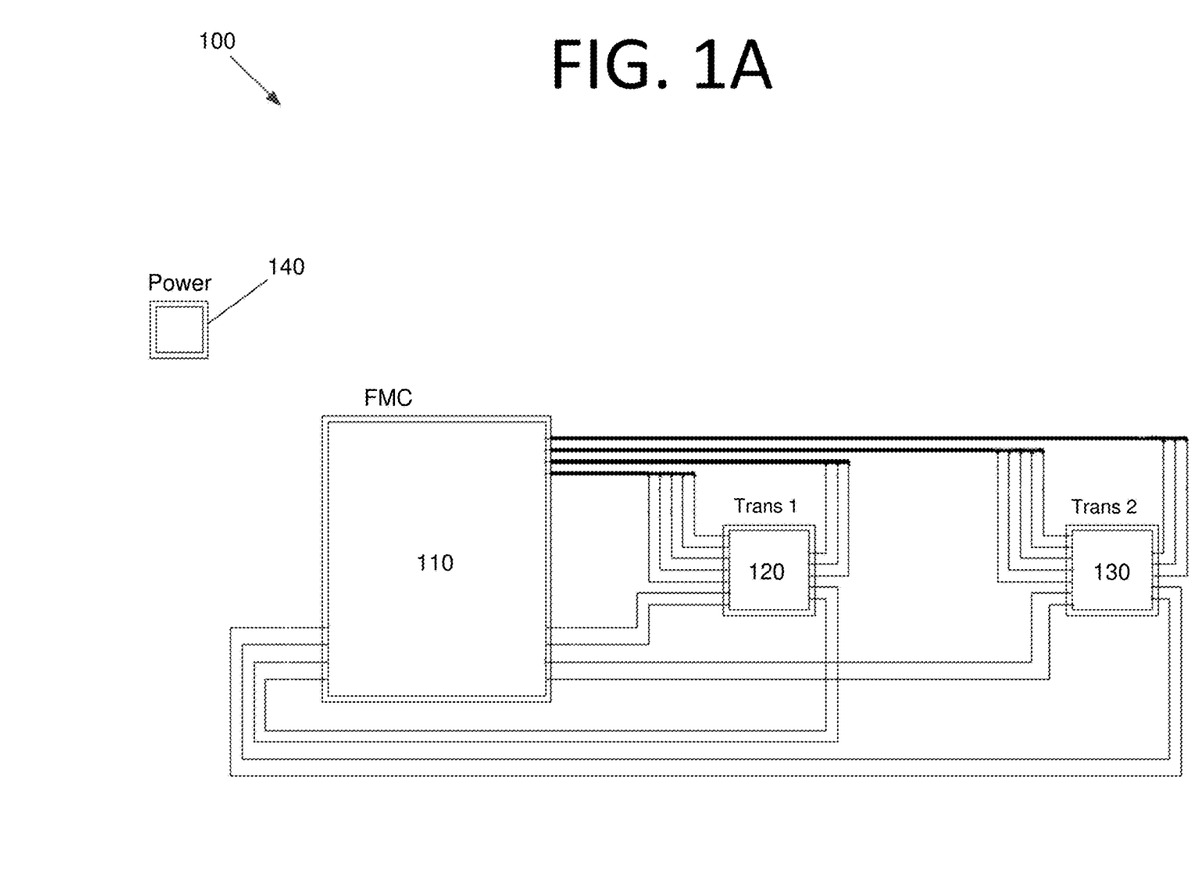
FIG. 1A is a circuit diagram illustrating a fiber optic transceiver FMC board with components and connections, according to an embodiment of the present invention.

FIG. 1A is a circuit diagram illustrating a fiber optic transceiver FMC board 100, according to an embodiment of the present invention. Fiber optic transceiver FMC board 100 includes an FMC 110, a first radiation-hardened transceiver 120, a second radiation-hardened transceiver 130, and a power supply 140. More specifically, FMC 110, first radiation-hardened transceiver 120, second radiation-hardened transceiver 130, and power supply 140 are sub-designs. FMC 110 contains information on FMC connections to the carrier board, and first radiation-hardened transceiver 120 and second radiation-hardened transceiver 130 may correspond to FIGS. 1C and 1D, respectively, and contain information on how the transceivers are connected to the rest of the circuit. Power supply 140 contains details on how input power to the board is filtered (external connections not shown).

Figure 1B:
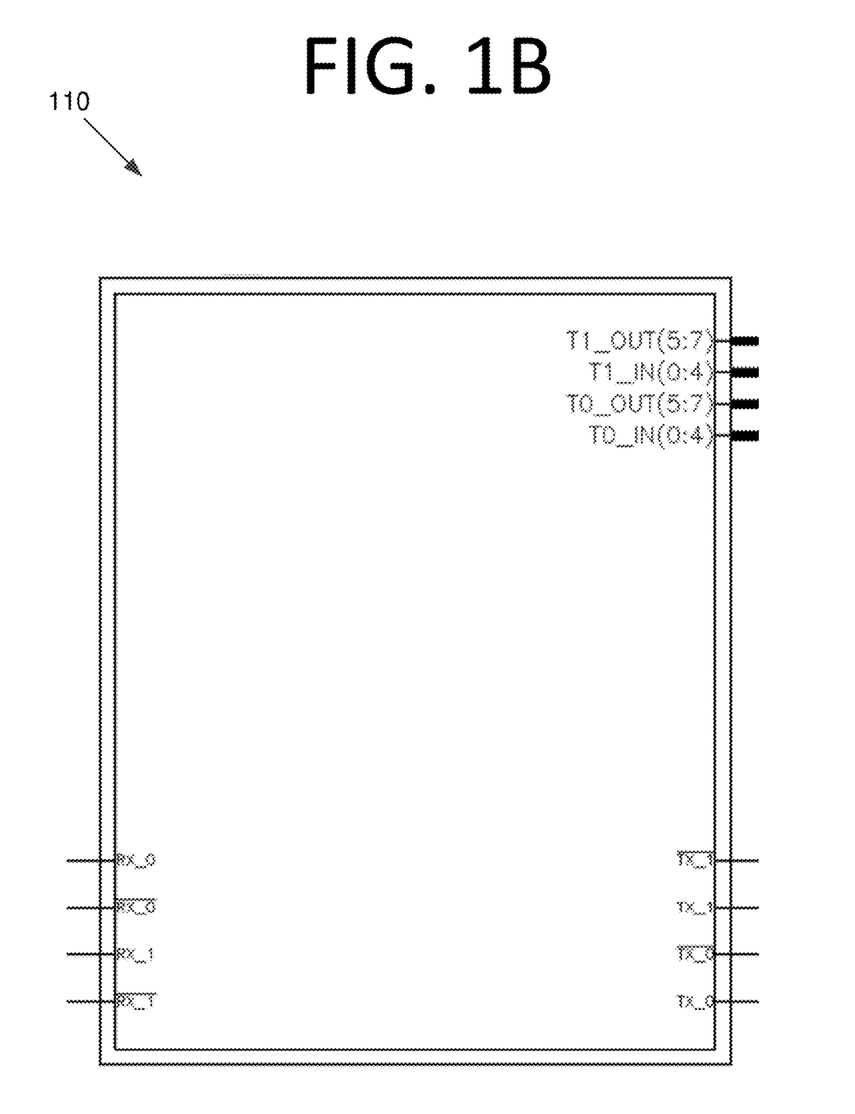
FIG. 1B is an enlarged circuit diagram illustrating the FMC of FIG. 1A with wire labels, according to an embodiment of the present invention.
Figure 1C:
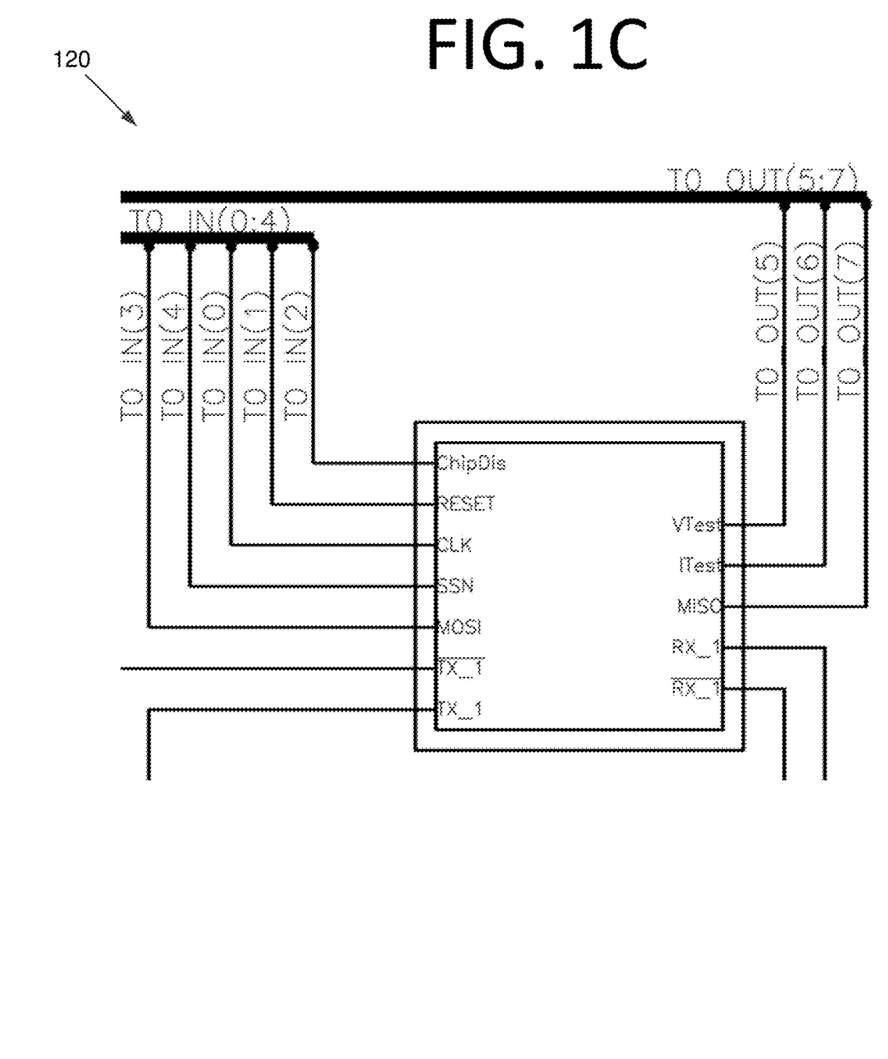
FIG. 1C is an enlarged circuit diagram illustrating radiation-hardened transceiver 1 of FIG. 1A with wire labels, according to an embodiment of the present invention.
Figure 1D:
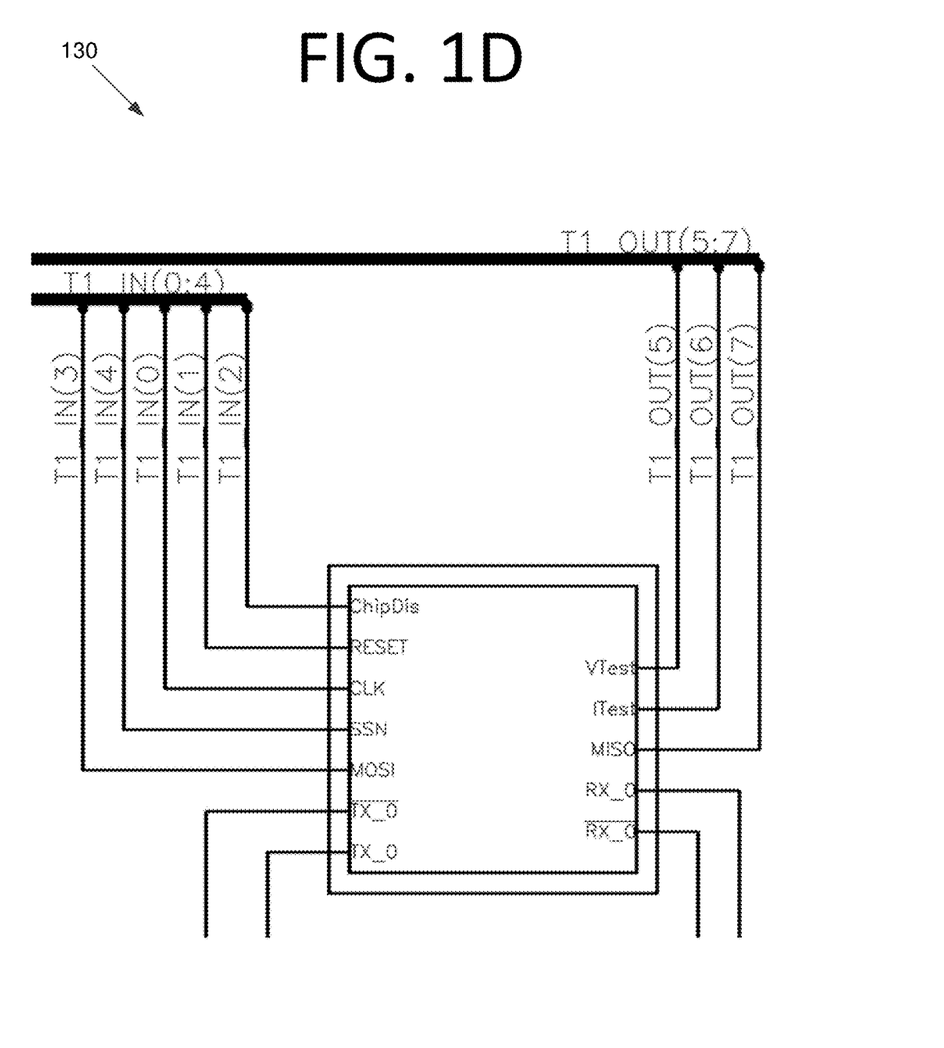
FIG. 1D is an enlarged circuit diagram illustrating radiation-hardened transceiver 2 of FIG. 1A with wire labels, according to an embodiment of the present invention.

FIG. 1B is an enlarged circuit diagram illustrating FMC 100 of FIG. 1A with wire labels, according to an embodiment of the present invention. More specifically, FIG. 1B is a hierarchical block from the top level of a schematic that represents the FPGA mezzanine card connector. FIG. 1C is an enlarged circuit diagram illustrating first radiation-hardened transceiver 120 of FIG. 1A with wire labels, according to an embodiment of the present invention. More specifically, FIG. 1C shows a hierarchical block representing the transceiver section of the circuit along with some detail on connection and bus names. The actual transceiver connection circuitry is one level down from this figure in the hierarchy. There are two identical transceivers on this circuit board, and FIG. 1D is a second instance of a radiation-hardened transceiver—more specifically, second radiation-hardened transceiver 130.

Figure 2:
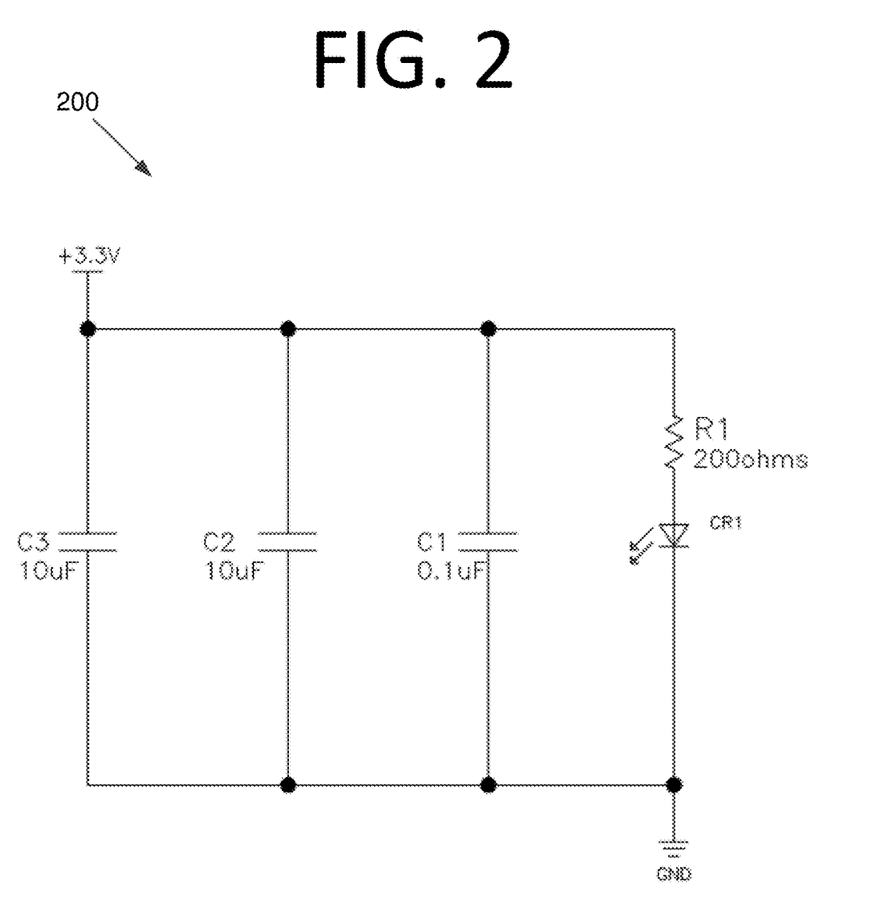
FIG. 2 is a circuit diagram illustrating a power supply, according to an embodiment of the present invention.

FMC 110 provides outputs to ChipDis (Chip Disable), reset (RESET), clock (CLK), SSN (Slave Select), and MOSI (Master Out Slave In) pins of each of transceivers 120, 130. FMC 100 also receives voltage test (VTest), current test (ITest), and MISO (Master In Slave Out) inputs from each of transceivers 120, 130. The high speed serial data is sent and received on TX and RX pins. The TX and RX pins are differential pins. The pins with the "overbar notation" are the complements of the pins without the overbar FIG. 2 is a circuit diagram illustrating a power supply 200, according to an embodiment of the present invention. More specifically, FIG. 2 is a schematic of the power conditioning circuit, composed of three capacitors, a resistor, and a light emitting diode (LED) to observe that power is on. This filters high frequency noise from the circuit.

Figure 3A:
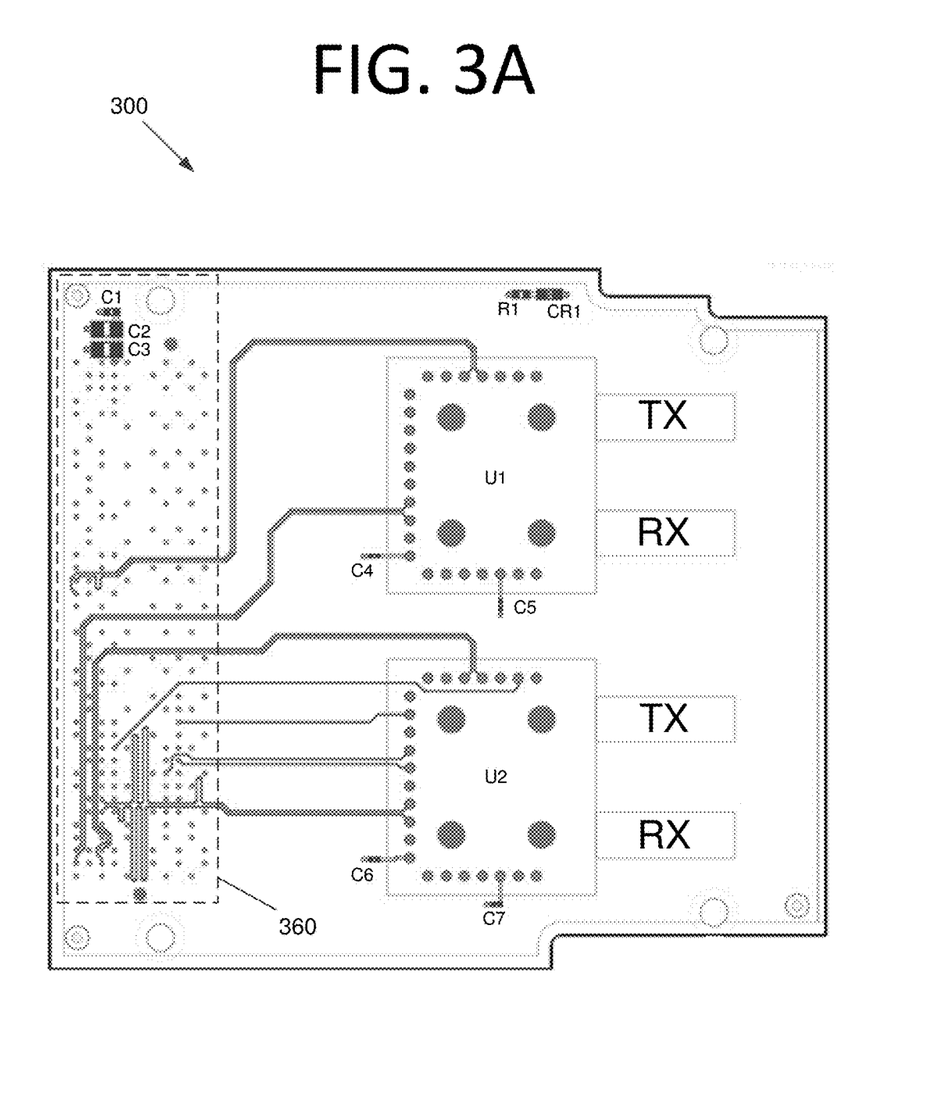
FIG. 3A illustrates a first layer of a printed circuit board that an FMC is manufactured from, according to an embodiment of the present invention.

FIG. 3A illustrates a first layer 300 of a printed circuit board that an FMC is manufactured from, according to an embodiment of the present invention. Controlled impedance differential-pair traces are manufactured on this layer using 1-ounce copper. Transmit and receive trace pairs connect the fiber-optic transceivers labeled U1 and U2 to an FMC connector 360 on the left side of FIG. 3A. The passive and active components are mounted on this layer of the printed circuit board. The passive components are the capacitors labeled C1 through C7. Capacitors C1 through C7 provide power supply bypassing and improve the power supply stability of the board. The passive resistor R1 is a current limiting resistor for the LED CR1. The fiber optic transceivers are the active components and are mounted in the locations labeled U1 and U2.

Figure 3B:
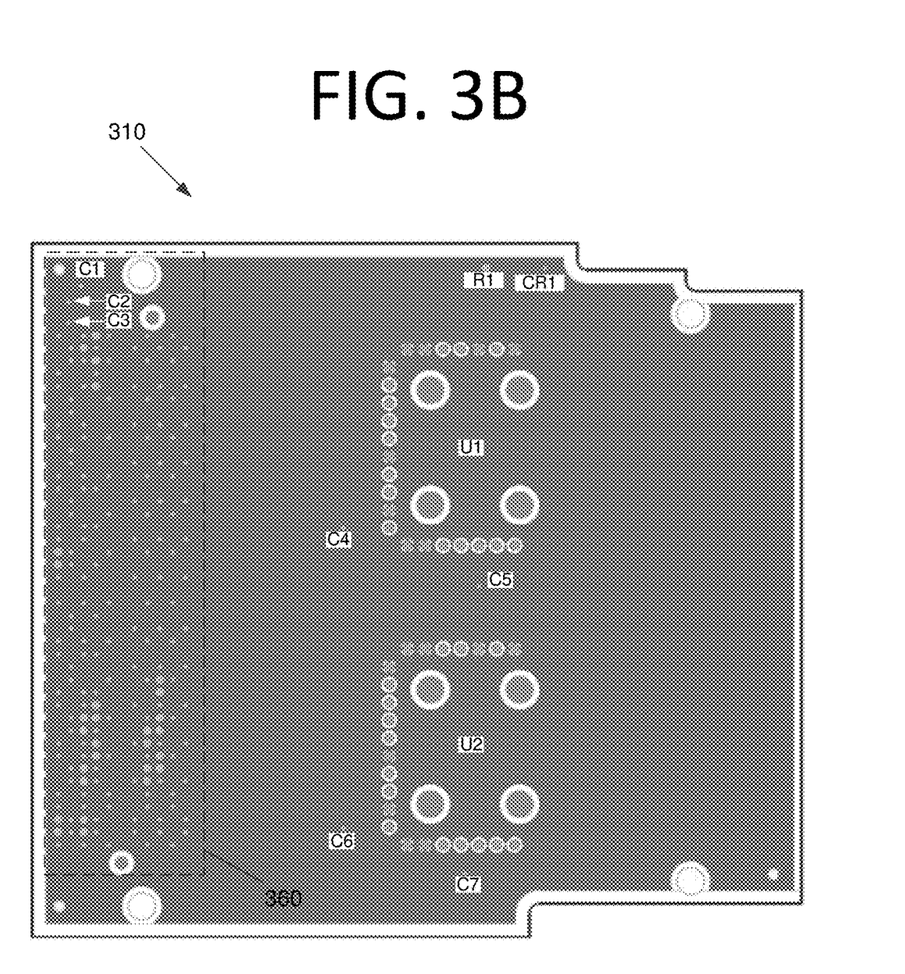
FIG. 3B illustrates a second layer of the printed circuit board that the FMC is manufactured from, according to an embodiment of the present invention.

FIG. 3B illustrates a second layer 310 of the printed circuit board that the FMC is manufactured from, according to an embodiment of the present invention. Second layer 310 is a solid ground plane and offers the design a level of signal integrity that would not be available without a dedicated ground plane layer. Ground pins on the fiber optic transceivers labeled U2 and U2 are directly connected to this ground plane, as are the grounded sides of the capacitors labeled C1 through C7.

Figure 3C:
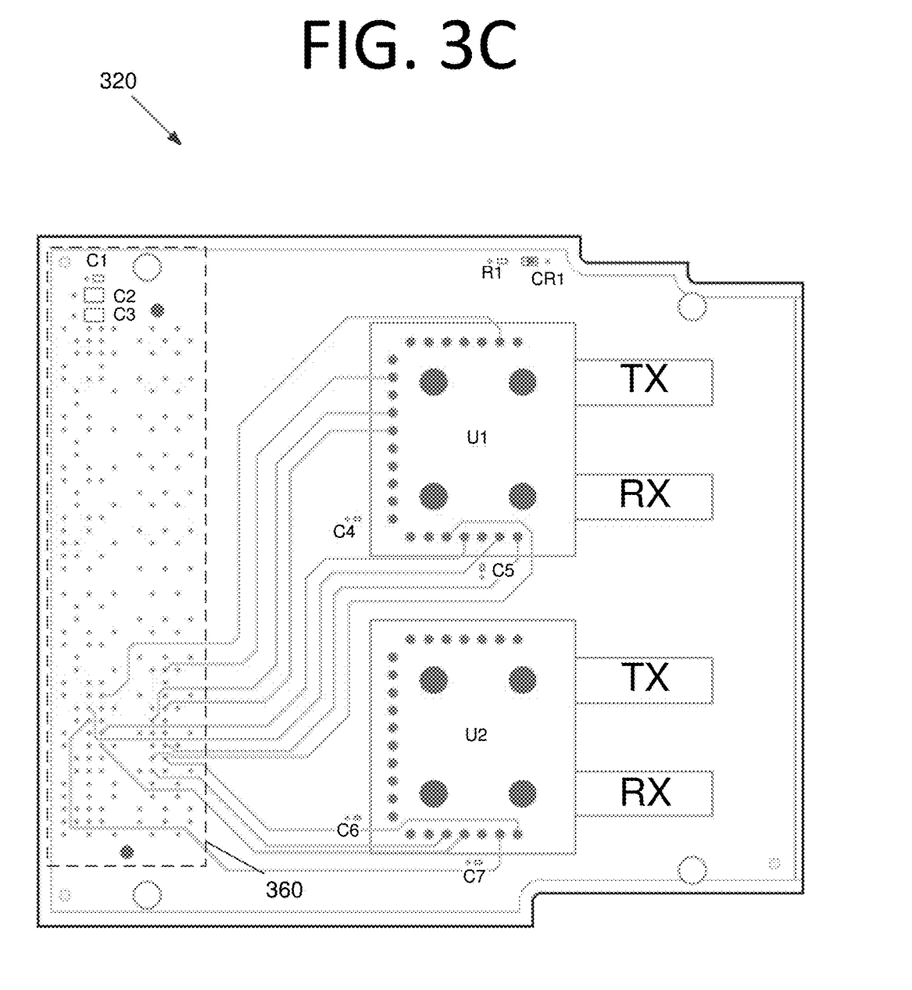
FIG. 3C illustrates a third layer of the printed circuit board that the FMC is manufactured from, according to an embodiment of the present invention.

FIG. 3C illustrates a third layer 320 of the printed circuit board that the FMC is manufactured from, according to an embodiment of the present invention. Lower speed serial peripheral interface (SPI) connections are routed on the traces on third layer 320. These traces are electrically single-ended instead of differential and do not require the same level of signal integrity as those on first layer 300 of FIG. 3A. The SPI traces control the configuration of the fiber-optic transceivers and not the actual data that is transmitted on and received on the optical fibers. The configuration of the FMC can be controlled the through these traces because they run to FMC connector 360 shown on the left side of FIG. 3C.

Figure 3D:
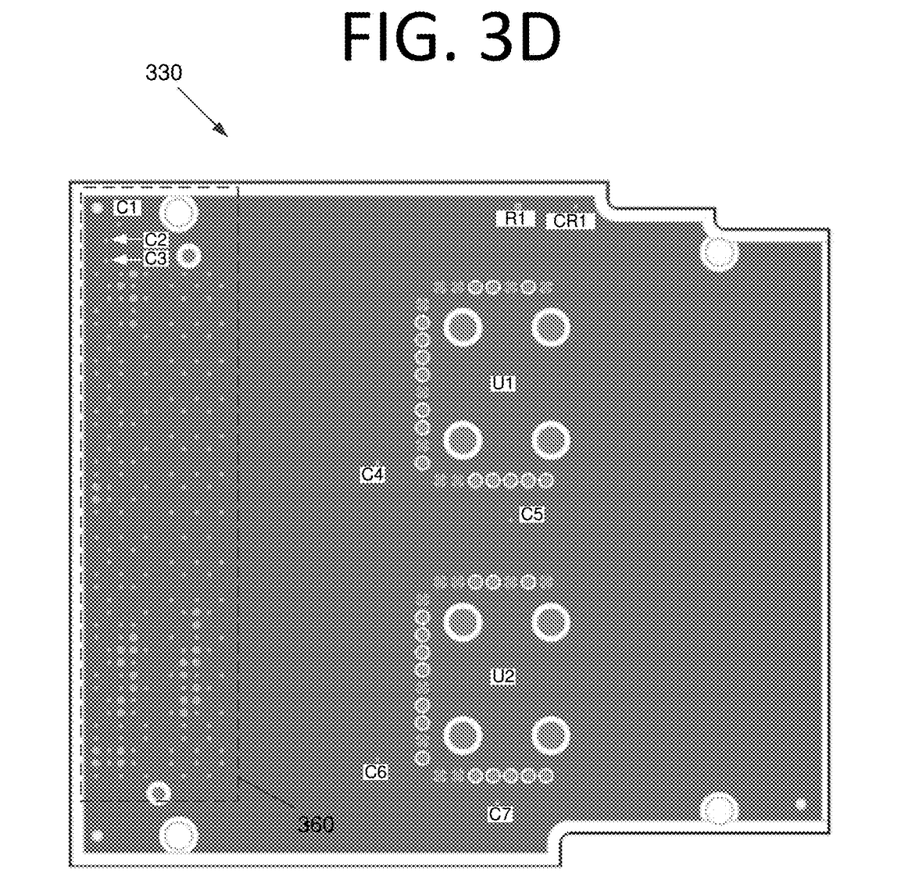
FIG. 3D illustrates a fourth layer of the printed circuit board that the FMC is manufactured from, according to an embodiment of the present invention.

FIG. 3D illustrates a fourth layer 330 of the printed circuit board that the FMC is manufactured from, according to an embodiment of the present invention. Fourth layer 330 is a second dedicated ground plane and is similar to the ground plane shown in FIG. 3B. Solid ground planes as manufactured on this layer improve signal integrity and reduce noise on a printed circuit board.

Figure 3E:
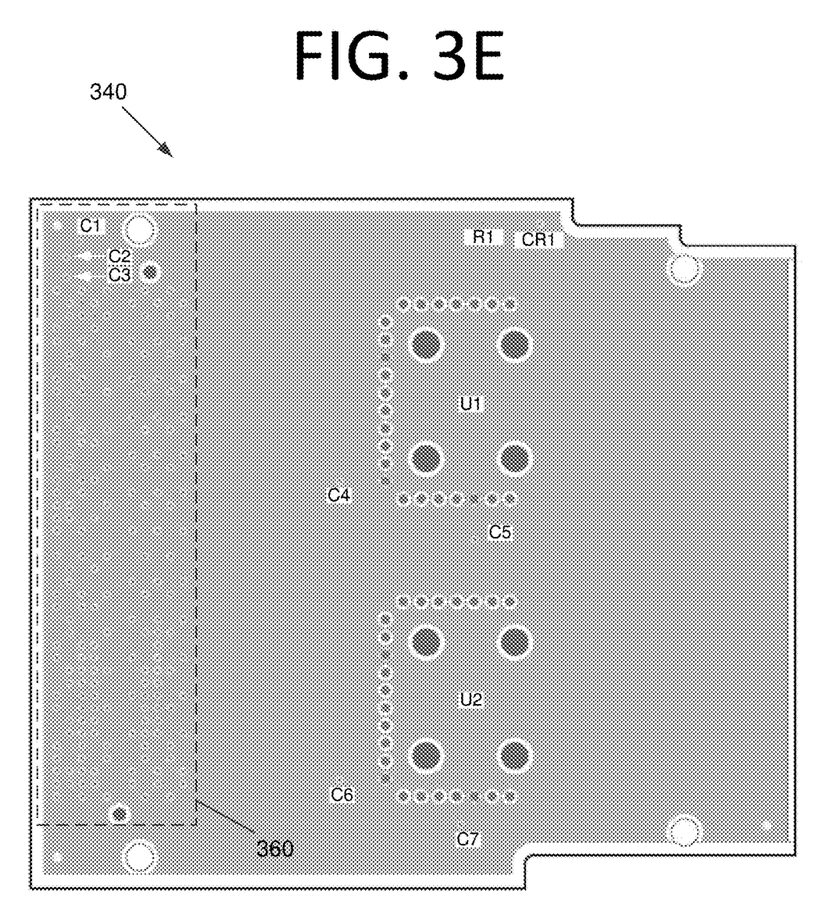
FIG. 3E illustrates a fifth layer of the printed circuit board that the FMC is manufactured from, according to an embodiment of the present invention.

FIG. 3E illustrates a fifth layer 340 of the printed circuit board that the FMC is manufactured from, according to an embodiment of the present invention. A solid power plane is manufactured on this layer. Power from FMC connector 360 on the left side of the board is supplied to this power plane and the fiber optic transceivers labeled U1 and U2 then draw power from this plane. A large solid power plane lowers power plane impedance and improves the performance of the printed circuit board.

Figure 3F:
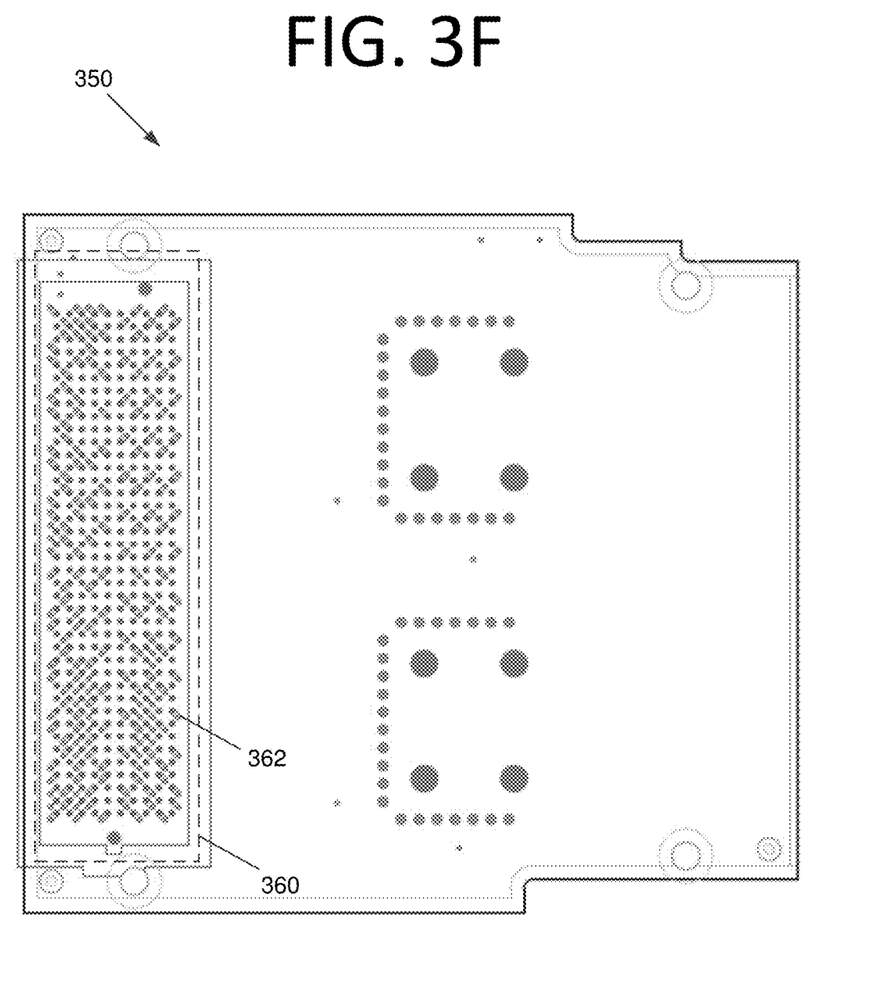
FIG. 3F illustrates a sixth layer of the printed circuit board that the FMC is manufactured from, according to an embodiment of the present invention.

FIG. 3F illustrates a sixth layer 350 of the printed circuit board that the FMC is manufactured from, according to an embodiment of the present invention. Sixth layer 350 contains "break-outs" 362 for pins of FMC connector 360 on the left side of the figure. The high density pins of FMC connector 360 should have small traces that allow each pin to "escape" or "break-out" from FMC connector 360 and then attach to internal traces on the printed circuit board. "Escaping" or "breaking-out" is a technique used to connect traces to pins on a printed circuit board when pins on a connector are very close to one another.

In some embodiments, radiation-hardened transceivers convert optical data to electronic data. Fiber optic cables (not shown) may be attached to the FMC at the connectors marked TX and RX in FIG. 3A. The optical data on the cables is converted to electrical signals that are sent and received at the pins on the devices (i.e., radiation-hardened fiber optic transceivers) located in the slots marked "U1" and "U2" in FIG. 3A. The electrical signals may be connected through copper traces on the circuit board to the connector represented by the hierarchical block in FIG. 1B.

The radiation-hardened transceiver has a transmitter and a receiver. The transmitter may be based on vertical cavity surface emitting laser (VCSEL) technology and the receiver may use a PIN diode. Both of these components may be fabricated in radiation-hardened grades.

Per the above, an FMC is an industry standard size card for the purpose of facilitating data transfer on or off a carrier card that contains a FPGA. FMCs from industry often contain analog-to-digital and digital-to-analog converters, interface electronics, and transceivers. However, no conventional FMC includes a radiation-hardened fiber optic transceiver.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention a claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A fiber optic transceiver Field Programmable Gate Array (FPGA) mezzanine card (FMC), comprising:
   a first slot for a first optical transceiver on a first layer of the FMC;
   a second slot for a second optical transceiver on the first layer of the FMC;
   a first fiber optic cable connector associated with the first slot for the first optical transceiver; and
   a second fiber optic cable connector associated with the second slot for the second optical transceiver, wherein
   the FMC comprises six layers that improve signal integrity and lower power plane impedance,
   one of the six layers comprises a dedicated ground plane that improves signal integrity and reduces noise on the FMC, and another of the six layers comprises an FMC connector and a plurality of controlled impedance differential pair traces that comprise transmit and receive trace pairs for each of the first slot and the second slot, the plurality of controlled impedance differential pair traces operably connected to the FMC connector.

2. The FMC of claim 1, wherein both passive and active components are mounted on the FMC.

3. The FMC of claim 1, wherein the FMC comprises a plurality of capacitors that provide power supply bypassing and improve power stability of the FMC.

4. The FMC of claim 3, wherein the FMC comprises seven capacitors.

5. The FMC of claim 1, wherein
a second layer of the six layers comprises a solid ground plane, and
ground pins on the first optical transceiver and the second optical transceiver, and grounded sides of a plurality of capacitors, are directly connected to the ground plane.

6. The FMC of claim 1, wherein a third layer of the six layers comprises:
a plurality of electrically single-ended traces; and
a plurality of lower speed serial peripheral interface (SPI) connections that control configurations of the first optical transceiver and the second optical transceiver, and are routed on the traces of the third layer.

7. The FMC of claim 1, wherein a fourth layer of the six layers comprises a dedicated ground plane that improves signal integrity and reduces noise on the FMC.

8. The FMC of claim 1, wherein
a fifth layer of the six layers comprises a solid power plane,
power from an FMC connector is supplied to the fifth layer, and
the first optical transceiver and the second optical transceiver then draw power from the fifth layer.

9. The FMC of claim 1, wherein
a sixth layer of the six layers comprises "break-outs" for pins of an FMC connector, and
the pins of the FMC connector comprise small traces that allow each pin to "escape" or "break-out" from FMC connector and then attach to internal traces on the FMC.

10. A fiber optic transceiver Field Programmable Gate Array (FPGA) mezzanine card (FMC), comprising:
a plurality of capacitors that provide power supply bypassing and improve power stability of the FMC; and
a plurality layers that improve signal integrity and lower power plane impedance wherein
one of the plurality of layers comprises a dedicated ground plane that improves signal integrity and reduces noise on the FMC, and
another of the plurality of layers comprises an FMC connector and a plurality of controlled impedance differential pair traces that comprise transmit and receive trace pairs for each of the first slot and the second slot, the plurality of controlled impedance differential pair traces operably connected to the FMC connector.

11. The FMC of claim 10, wherein
a layer of the six layers comprises a solid ground plane, and
ground pins on a first optical transceiver and a second optical transceiver, and grounded sides of a plurality of capacitors, are directly connected to the ground plane.

12. The FMC of claim 10, wherein a layer of the plurality of layers comprises:
a plurality of electrically single-ended traces; and
a plurality of lower speed serial peripheral interface (SPI) connections that control configurations of the first optical transceiver and the second optical transceiver, and are routed on the traces of the layer.

13. The FMC of claim 10, wherein a layer of the plurality of layers comprises a dedicated ground plane that improves signal integrity and reduces noise on the FMC.

14. The FMC of claim 10, wherein
a layer of the plurality of layers comprises a solid power plane,
power from an FMC connector is supplied to the layer, and
the first optical transceiver and the second optical transceiver then draw power from the layer.

15. The FMC of claim 10, wherein
a sixth layer of the plurality of layers comprises "break-outs" for pins of an FMC connector, and
the pins of the FMC connector comprise small traces that allow each pin to "escape" or "break-out" from FMC connector and then attach to internal traces on the FMC.

16. A fiber optic transceiver Field Programmable Gate Array (FPGA) mezzanine card (FMC), comprising:
a first layer comprising an FMC connector and a plurality of controlled impedance differential pair traces that comprise transmit and receive trace pairs for each of the first slot and the second slot, the plurality of controlled impedance differential pair traces operably connected to the FMC connector;
a second layer comprising a first ground plane, wherein ground pins on a first optical transceiver and a second optical transceiver and grounded sides of a plurality of capacitors are directly connected to the first ground plane;
a third layer comprising a plurality of electrically single-ended traces and a plurality of lower speed serial peripheral interface (SPI) connections that control configurations of the first optical transceiver and the second optical transceiver, and are routed on the traces of the third layer;
a fourth layer comprising a second ground plane that improves signal integrity and reduces noise on the FMC;
a fifth layer comprising a solid power plane, wherein power from the FMC connector is supplied to the fifth layer and the first optical transceiver and the second optical transceiver then draw power from the fifth layer; and
a sixth layer comprising "break-outs" for pins of the FMC connector, wherein the pins of the FMC connector comprise small traces that allow each pin to "escape" or "break-out" from FMC connector and then attach to internal traces on the FMC.

17. The FMC of claim 16, wherein both passive and active components are mounted on the FMC.

18. The FMC of claim 16, wherein the FMC comprises seven capacitors.

* * * * *